United States Patent [19]

Korinsky

[11] Patent Number: 5,185,691

[45] Date of Patent: Feb. 9, 1993

[54] THERMAL PACKAGING FOR NATURAL CONVECTION COOLED ELECTRONICS

[75] Inventor: George K. Korinsky, Houston, Tex.

[73] Assignee: Compaq Computer Corporation, Houston, Tex.

[21] Appl. No.: 670,347

[22] Filed: Mar. 15, 1991

[51] Int. Cl.[5] .............................................. H05K 7/20
[52] U.S. Cl. .................................. 361/386; 361/383; 361/392; 361/394
[58] Field of Search ................ 307/150; 361/383, 386, 361/388–389, 392, 394, 395, 399; 363/141, 144

[56] References Cited

U.S. PATENT DOCUMENTS

| | | | |
|---|---|---|---|
| 3,462,553 | 8/1969 | Spranger | 361/383 |
| 3,857,044 | 12/1974 | Papoi et al. | 361/383 |
| 3,934,177 | 1/1976 | Horbach | 361/388 |
| 4,471,407 | 9/1984 | Sleder | 361/387 |
| 4,528,615 | 7/1985 | Perry | 361/387 |
| 4,639,836 | 1/1987 | Mayer | 361/383 |
| 4,872,102 | 10/1989 | Getter | 361/383 |
| 4,879,632 | 11/1989 | Yamamoto et al. | 361/386 |
| 5,031,072 | 7/1991 | Malhi et al. | 361/387 |
| 5,060,114 | 10/1991 | Feinberg et al. | 361/387 |

FOREIGN PATENT DOCUMENTS

| | | | |
|---|---|---|---|
| 0152254 | 11/1981 | Japan | 361/383 |
| 2052164 | 1/1981 | United Kingdom | 361/383 |

Primary Examiner—Gregory D. Thompson
Attorney, Agent, or Firm—Pravel, Gambrell, Hewitt, Kimball & Krieger

[57] ABSTRACT

A natural convection cooled electronic device utilizing a box-like plastic enclosure surrounding the circuitry of the electronic device. The apparatus further includes aluminum heat sinks fastened in good thermal contact with heat dissipating components of the electronic device, wherein the heat sinks include heat fin members which run parallel to the inner walls of the enclosure and are separated from the walls by an air gap. The inner walls of the enclosure are lined with a layer of thermally conductive material, such as copper foil, which spreads the internal heat flux across the total surface area of the enclosure. The exposed surface of the heat flux spreader layer and the facing surface of the heat fin members are further made semi-rough and stained black to eliminate potential hot spots and to increase radiant heat transfer between the heat sinks and the enclosure.

28 Claims, 2 Drawing Sheets

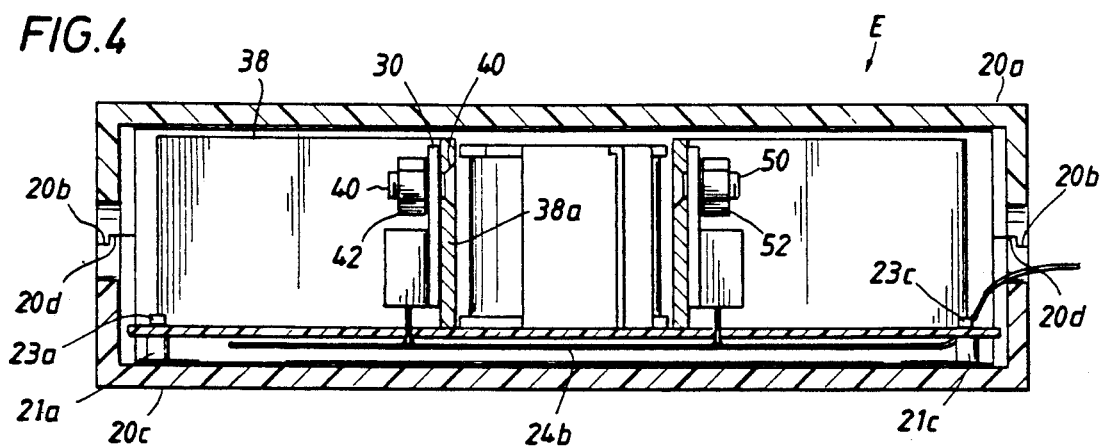
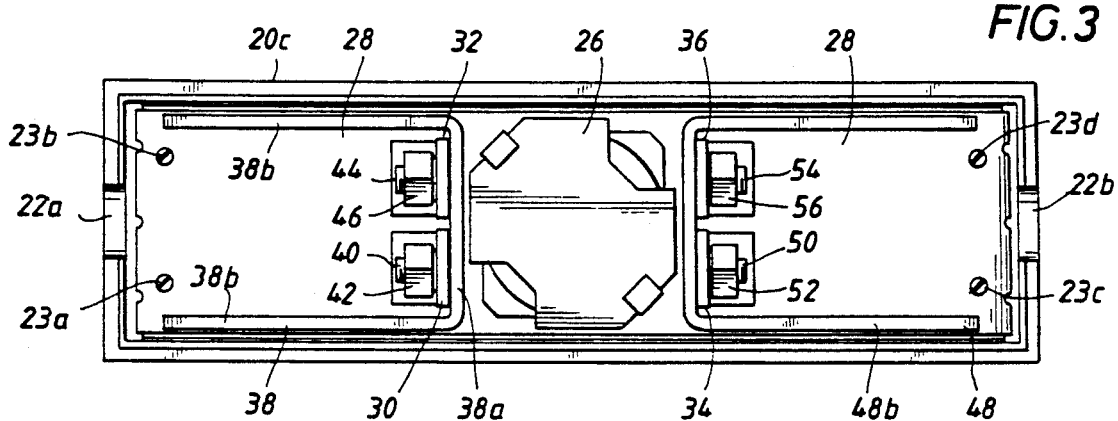
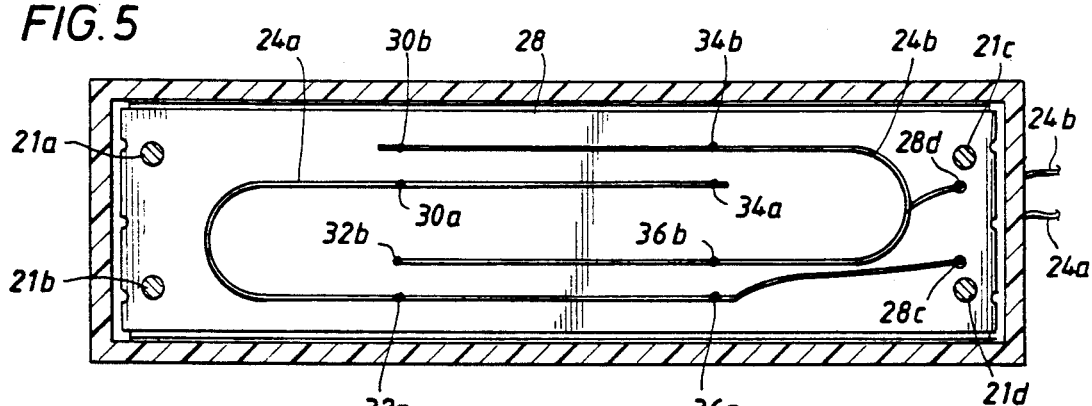
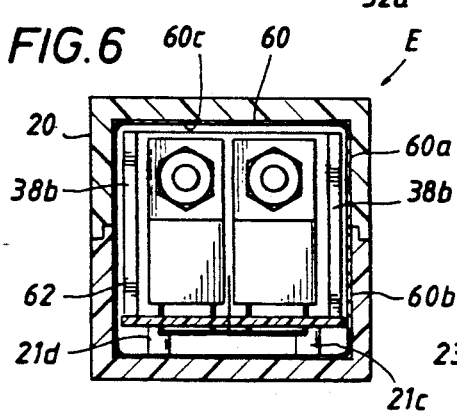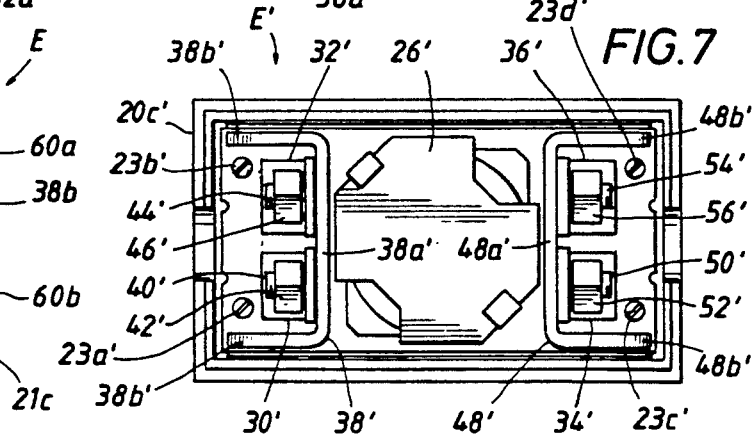

THERMAL PACKAGING FOR NATURAL CONVECTION COOLED ELECTRONICS

SPECIFICATION

BACKGROUND OF THE INVENTION

1. Field of the Invention

The present invention relates to thermal packaging for natural convection cooled electronics.

2. Description of Prior Art

Power converters are necessary to convert readily available forms of power, such as power from an ac outlet or from a battery, to regulated power required by many electronic devices including laptop computers. Some of the power during the power conversion process is inevitably converted to thermal energy which must be dissipated at a high enough rate to prevent excessive heat build up and product failure. The packaging used to contain the power converter usually includes the means to diffuse the extraneous thermal energy, otherwise known as the dissipated power.

Thermal requirements have been established within the electronic industry world-wide by various agencies such as Canadian Standards Agency (CSA), Underwriter's Laboratories (UL) and Technischer Überwachungs-Verein (TÜV) which define tolerable thermal limits that allow safe product operation. These thermal limits are usually in the form of allowable temperature increases from the device maximum specified operating ambient air temperature as well as maximum temperature limits. One applicable and particularly stringent standard is UL 1950, sections 1.4.7, 1.4.8, and 5.1, which specifies, among other things, proper thermal test procedures and allowable temperature rises from ambient.

The demands of the computer market require that the power converter for a laptop computer be designed as small and lightweight as possible. The size and weight of the converter, however, depends not only on elements of the converter itself but also on the allowable dissipative power density of the packaging. It is desirable, therefore, to increase the dissipated power density of the packaging as much as possible without increasing its weight in order to decrease the size of the power converter and to stay within acceptable industry thermal standards.

Natural convection using air as the heat transfer medium is presently the preferred method to dissipate thermal energy from laptop computers and/or power converters. Air in the enclosure exhibits very low thermal conductivity which tends to decrease the tolerable dissipated power density of the power converter. Forced convection methods (a fan for example) and alternative heat transfer media are undesirable in laptop computer power converters since they would increase the size, cost and weight above acceptable limits. Since the thermal dissipation of natural convection using air as the thermal medium is limited, several methods have been developed to enhance the dissipated power density of natural convection cooled electronics.

The most common electronic packaging method used in the industry to date for a natural convection cooled devices is to design a highly efficient converter and place it in a volume large enough, normally calculated based on 250 milliwatts per cubic inch (mW/in$^3$) using the conventional heat sinks in air method, to dissipate an adequate amount of heat to meet thermal limits. If the package size necessary to house the device using this technique was considered too large from a marketing standpoint then the thermal designer would shrink the unit by applying existing technology such as the addition of a fan or encapsulation of the unit. Both of these are expensive but effective solutions to the problem.

Encapsulation is the predominate method used to solve thermally related packaging problems by increasing tolerable dissipative power densities of natural convection cooled electronics wherein all components are encapsulated, or potted, with a material exhibiting a high thermal conductivity. Encapsulation is very effective and can increase the thermal dissipation densities to approximately 1500 mW/in$^3$ or more. The encapsulation materials, however, are expensive and difficult to use. The prevailing cost is due to labor for handling and curing the potting materials. The potting materials also possess high densities which add unwanted weight. Several of these materials cause problems for electronic devices like transformers and electrolytic capacitors during the curing process because mechanical stress is incurred. Furthermore, encapsulation does not directly dispose of the heat externally but rather redistributes the heat from the heat generating components to surrounding internal circuitry. This approach brings all components in the device closer to an isothermal situation. The now solid internal ambient temperature of the entire power converter increases, affecting heat susceptible components and overall circuit reliability.

SUMMARY OF THE INVENTION

The thermal packaging apparatus of the present invention operates well within the standards specified by UL 1950 while achieving the same or greater dissipated power density as encapsulation with little added weight and cost. The present invention directs the heat flux from the power dissipating devices to the exterior enclosure walls and hence reduces internal ambient temperature. The present invention requires no additional handling, special equipment, curing time or heat activated catalysts. Furthermore, the present invention causes no mechanical stress on the components of the electronic device.

The apparatus of the present invention comprises a box-like plastic enclosure which encompasses the circuitry of an electronic device. The apparatus further comprises heat sink plates made from aluminum, copper, magnesium, or the like, which are fastened in good thermal contact to any components dissipating substantial amounts of heat. The heat sinks include heat fin members which traverse a plane which is parallel to the inner walls of a plastic enclosure and separated from the walls by as small an air gap as possible. The heat sinks provide a thermally conductive path to convey heat away from the components to the enclosure walls. The heat dissipates across the air gap, to a continuous layer of material with a high thermal conductivity which spreads the heat flux throughout the plastic enclosure which is then transferred through the enclosure wall to the surrounding air. Ideally, the surface area of the heat fin members should face and run parallel to the enclosure walls to maintain a one to one relationship between the surface areas to maximize thermal transfer to the enclosure wall.

The inner walls of the plastic enclosure may be lined with a thin, preferably continuous film of material that exhibits high thermal conductivity, such as copper, magnesium or aluminum foil or the like, which spreads the internal heat flux across the total surface area of the walls of the plastic enclosure. Preferably, the surface of this heat flux spreader material and the heat fin members are made semi-rough and stained black to eliminate any hot spots on the exterior and to increase the heat transfer between the heat sink and the enclosure wall. The plastic enclosure may be doped with a material of high thermal conductivity to increase the overall thermal conductivity of the enclosure.

The air gap between the heat sink and the plastic enclosure should be as small as possible to facilitate increased heat transfer. If a component is not at a ground potential, it can be electrically isolated from the heat sink with a thermally conductive isolation pad. This will allow the heat sink to be designed such that the air gap between it and the heat flux spreader is kept minimal. There are several options that can be taken to minimize the air gap between the heat fin and the heat flux spreader. For instance, the heat sink can be tied to earth ground or the primary return to further decrease the air gap required between the heat fin and the heat flux spreader.

BRIEF DESCRIPTION OF THE DRAWINGS

A better understanding of the present invention can be obtained when the following detailed description of the preferred embodiment is considered in conjunction with the following drawings, in which:

FIG. 3 is a top view of the electronic device looking along lines 3—3 of FIG. 1;

FIG. 4 is a cross-sectional side view of the electronic device looking along lines 4—4 of FIG. 2;

FIG. 5 is a cross-sectional bottom view of the electronic device looking along lines 5—5 of FIG. 1;

FIG. 6 is a cross-sectional end view of the electronic device looking along lines 6—6 of FIG. 2; and FIG. 7 is a top view of an alternate electronic device constructed according to the present invention.

DETAILED DESCRIPTION OF THE PREFERRED EMBODIMENT

Figure 1:
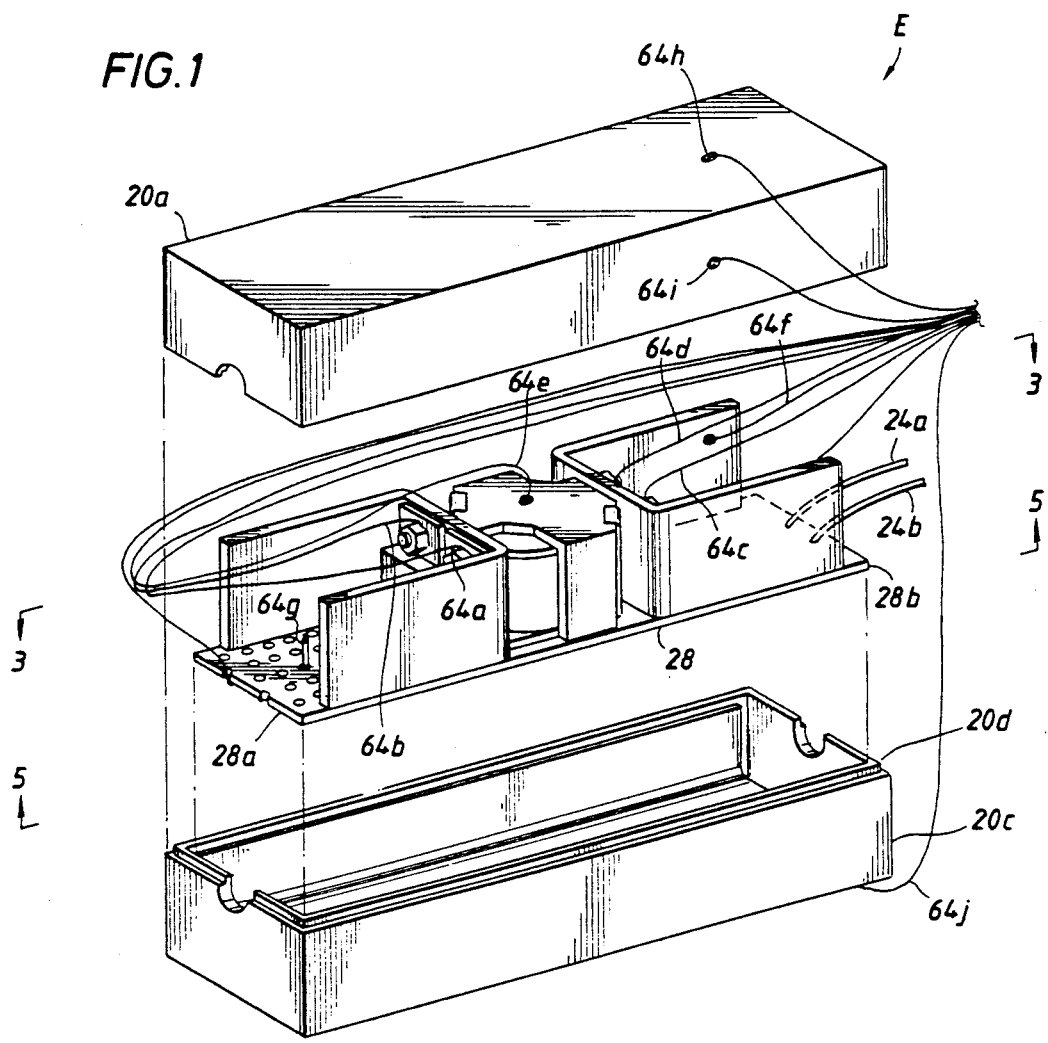
FIG. 1 is an exploded perspective view illustrating an electronic device constructed according to the present invention.

Referring to the drawings, FIG. 1 is an exploded perspective view illustrating an electronic device, generally referred to by the letter E, constructed according to the present invention. The electrical components of the electronic device E are mounted onto a rectangular circuit board 28, and this assembly is placed into the lower half member 20c of a hollow box-like enclosure 20 (FIG. 2), which is preferably shaped like a rectangular parallelepiped. The electronic device E illustrated in the drawings is a test device used for thermal characteristic evaluations, but is similar in size and shape to the intended electronic devices to be used with the present invention, such as dc—dc converters and the like. The enclosure 20 is preferably made of any of the organic polymeric compositions commonly used as structural plastics such as polyesters, especially a thermoplastic polyester sold under the trade mark Valox by General Electric, acrylonitrile-butadiene-styrenes (ABS), polycarbonates, and the like. It is desirable that the organic polymeric composition used be able to conduct heat readily and not melt at the temperature of use. Furthermore, the organic polymeric composition may be filled with a conductive filler such as aluminum or copper powder, or the like, to increase the heat conductivity of the composition. The enclosure 20 comprises an upper half member 20a and the lower half member 20c. The lower half member 20c includes a rabbet 20d that protrudes above the inside of its upper edge, and the upper half member 20a includes a similar rabbet 20b (FIG. 4) along its lower edge to mate with the lower rabbet 20d.

The enclosure 20 preferably includes flat surfaces and squared-off corners to facilitate ease of construction. The enclosure 20 of the preferred embodiment is approximately 1.25" wide by 1.25" tall by 4.25" long and its walls approximately 0.09375" thick such that the interior dimensions of the enclosure 20 are approximately 1" by 1" by 4". The rabbet 20d of the lower half member 20c is approximately 0.03125" wide and 0.0597" deep, and the rabbet 20b of the upper half member 20a is approximately the same dimensions as the rabbet 20d.

Figure 2:
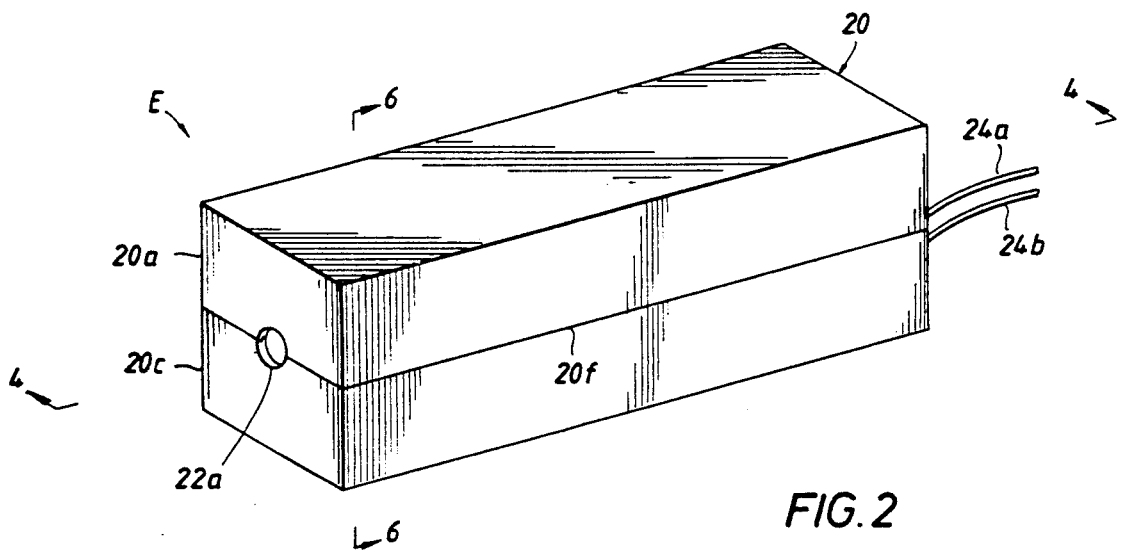
FIG. 2 is a perspective view of the electronic device of FIG. 1.

FIG. 2 is a perspective view showing the outside of the assembled enclosure 20 of the electronic device E of FIG. 1. The upper half member 20a and the lower half member 20c join together such that the rabbets 20b and 20d lock together (FIG. 4) at approximately the longitudinal centerline 20f of the sides and ends of the assembled enclosure 20. The walls of the assembled enclosure 20 are preferably flat, but could include curvilinear portions if such curvilinear portions would be more convenient depending upon the shape of the electronic device E being packaged. Two holes 22a and 22b (FIG. 3), each having an approximate diameter of 0.0323", are drilled at each end of the assembled enclosure 20 to facilitate entry of input and output wires, such as the wires 24a and 24b.

FIG. 3 is a top view of the electronic device E with the upper half member 20a removed. A power transformer 26, the size of which is typical of a transformer used in a dc—dc power converter for a laptop computer, is mounted in the center of the circuit board 28. The transformer 26 is not electrically coupled in the illustrated embodiment and is present for thermal measurements only in the illustrated embodiment. Four 10 ohm power resistors 30, 32, 34 and 36, each in TO-220 packaging, are mounted to the circuit board 28. The resistors 30 and 32 are mounted side by side next to one side of the transformer 26 facing away from the transformer 26, and the resistors 34 and 36 are mounted similarly on the opposite side of the transformer 26 facing the opposite direction. The resistors 30, 32, 34 and 36 simulate transistors, diodes, thyristors or other electronic elements conventionally used in electronic devices.

The lower half member 20c of the enclosure 20 may include four bosses 21a, 21b, 21c and 21d (FIG. 5) integrally formed on the bottom portion near the four corners, respectively, of the lower half member 20c, which preferably comprises the same material as the enclosure 20. As shown more clearly in FIG. 4, the circuit board 28 is placed within the lower half member 20c to rest on the bosses 21a–21d, where the bosses 21a–21d have an appropriate height to separate the circuit board 28 from the lower wall or bottom of the enclosure 20. Four screws 23a, 23b, 23c and 23d are placed through corresponding holes (not shown) of the circuit board 28 and are screwed into the bosses 21a–21d, respectively, to mount the circuit board 28 to the lower half member 20c of the enclosure 20. In this manner, the circuit board 28 is securely mounted within the enclosure 20.

A generally U-shaped heat sink 38 includes a flat center fastening member 38a and two flat heat fin members 38b, which are integrally formed with and extend transversely with respect to each end of the fastening member 38a. The heat sink 38 is preferably made from a high thermal conductivity material, such as aluminum, copper, magnesium or the like, and is preferably about 0.065" thick. The heat sink 38 is oriented to lie flat on its side on the circuit board 28 such that its fastening member 38a is located between the transformer 26 and the resistors 30 and 32 and wherein its heat fin members 38b extend vertically upwards above the sides of the circuit board 28, outward towards one end 28a of the circuit board 28 and parallel to the sides of the enclosure 20 (FIG. 1).

FIG. 4 is a cross-sectional side view of the electronic device E. The resistor 30 is fastened to the heat sink 38 with a bolt 40 and a nut 42. The bolt 40 is placed through the fastening member 38a and through the resistor 30, and the nut 42 is securely screwed onto the bolt 40. Thermal heat sink compound can be used if desired to further improve the thermal coupling or to electrically isolate the heat sink 38 and the device. In a similar fashion, the heat sink 38 is fastened to the resistor 32 with the bolt 44 and the nut 46 (FIG. 3). In this fashion, the heat sink 38 is securely fastened to and in good thermal contact with the resistors 30 and 32. Other means, as would be appreciated by those skilled in the art, could be used to establish good thermal contact between the heat sink 38 and the resistors 30 and 32.

In the manner described above, most of the heat generated by the resistors 30 and 32 is transferred to the fastening member 38a of the heat sink 38. The heat is then conveyed to the heat fin members 38b which, as described, are integrally formed with the fastening member 38a. The heat sink 38, therefore, forms a thermal conductive path which conveys heat away from the heat generating resistors 30 and 32 to the heat fin members 38b. The heat is further communicated to the enclosure 20 as will be more fully described below.

Another heat sink 48, preferably the same shape and material as the heat sink 38, is fastened in a similar fashion to the resistors 34 and 36 using two bolts 50 and 54 and two nuts 52 and 56 respectively. The heat sink 48 is also physically oriented with respect to the resistors 34 and 36 in the same manner as the heat sink 38 is oriented to the resistors 30 and 32 such that its two heat-fin members 48b extend towards the opposite end 28b of the circuit board 28 (FIG. 1). The heat sink 48 functions to convey heat away from the resistors 34 and 36 in the same manner as the heat sink 38 conveys heat away from the resistors 30 and 32.

FIG. 5 is a cross-sectional bottom view of the electronic device E illustrating the wires 24a and 24b routed on the bottom side of the circuit board 28. The wire 24a is routed and connected to one terminal of each of the resistors 30, 32, 34 and 36 at the soldered locations 30a, 32a, 34a and 36a respectively, and the wire 24b is routed and connected to the opposite terminals of each of the resistors 30-36 at the soldered locations 30b, 32b, 34b and 36b respectively. The wires 24a and 24b are then routed through the circuit board 28 through two holes 28c and 28d respectively, and then out of the electronic device E through the hole 22b for external connection. In the illustrated embodiment, the wires 24a and 24b are discretely connected to the resistors 30, 32, 34 and 36, but it is understood that the circuit board 28 conventionally contains traces interconnecting the various elements of the electronic device E and the wires 24a and 24b are only used for the external connections.

FIG. 6 is an cross-sectional end view of the electronic device E. The inner walls of the enclosure 20 are preferably lined with a flexible heat flux spreader layer 60. The heat flux spreader layer 60 is preferably made of a thermally conductive material, such as metal foil made of copper or aluminum or the like, or a thermally conductive coating applied to the inner surfaces of the enclosure 20 through an electro-plating or other coating process. It is desirable that the heat flux spreader layer 60 spreads the internal heat flux radiated and convected from the heat sinks 38 and 48 across the total surface area of the walls of the enclosure 20. For practical purposes, the heat flux spreader layer 60 could comprise a layer 60a on the inner surfaces of the upper half member 20a, and a layer 60b on the inner surfaces of the lower half member 20c.

If the heat flux spreader layer 60 is made of a metal foil, the foil is shaped to conform to the inner walls of the enclosure 20, and then bonded to the walls with a glue or other adhesive which preferably has a high thermal conductivity. Preferably, the entire interior or exposed surface 60c of the heat flux spreader layer 60 as well as the surfaces of the heat sinks 38 and 48 facing the heat flux spreader layer 60 are made semi-rough and stained black to increase the radiant heat transfer between the two surfaces and eliminate any hot spots on the exterior.

The heat sinks 38 and 48 are formed such that they are in good thermal contact with the resistors 30, 32, 34 and 36, and, in general, any other component that generates a significant amount of heat within an electronic device, such as the electronic device E, such as power resistors, diodes, transistors, transformers or the like. The heat sinks 38 and 48 include the heat fin members 38b and 48b which align next to and run parallel with the inner walls of the enclosure 20 (FIG. 3), separated from the heat flux spreader sheet 60 by an air gap 62. The air gap 62 should be as small as possible to maximize the heat transfer. Preferably the heat sink 38 is at earth ground or a return voltage to decrease the air gap 62 mandated by voltages differences.

In general, the enclosure 20 is made as small as possible to enclose all of the components yet large enough to include the heat flux spreader layer 60 and the heat sinks 38 and 48. The surface areas of the heat fin members 38b and 48b facing the heat flux spreader layer 60 are made as large as possible to maximize the amount of heat transferred between the heat sinks 38 and 48 and the enclosure 20 to maximize the amount of heat communicated. While not shown in the drawings, the enclosure 20 can include additional heat fin members (not shown) running parallel with the top of enclosure 20 to provide additional heat transfer.

FIG. 1 further illustrates ten welded junction J-type thermocouples 64a-j with 30 gauge wires used to measure the temperature at ten locations. Each of the thermocouples 64a-j, except for the thermocouple 64g, is attached at its respective location using thermal epoxy to create a good thermal contact. The thermocouples 64a, 64b, 64c and 64d are each attached to the resistors 30, 32, 34 and 36, respectively. The thermocouple 64e is attached to the top side of the transformer 26. The thermocouple 64f is attached to the inner side towards the end of the heat fin member 48b of the heat sink 48.

A thermocouple 64g is mounted through the circuit board 28 about halfway between the resistors 30 and 32 and the end 28a of the circuit board 28. Three more thermocouples 64h-j are attached toward one end of the exterior of the enclosure 20. These locations allow the temperature to be measured at the ten specified locations using the thermocouples 64a-j as known to those skilled in the art.

The method of measuring the dissipated power density of the electronic device E will now be described. The test procedures used are within the acceptable procedures as specified in UL 1950. The maximum room ambient temperature is specified as 40° C. for the desired embodiments, and the electronic device E is tested in continuous operation until steady state temperature conditions are established. All temperatures are measured using the thermocouples 64a-j as described above.

A known voltage was placed across the wires 24a and 24b such that the resistors 30, 32, 34 and 36 are electrically in parallel, and the current passing through the wires 24a and 24b was measured. The amount of thermal power dissipated by the resistors 30, 32, 34 and 36 within the electronic device E was calculated by multiplying the voltage across the resistors 30, 32, 34 and 36 by the current through them. Since the internal volume of the enclosure 20 is known, the dissipated power density was easily calculated by dividing the amount of power dissipated, by the volume of the enclosure 20. The volume used in the calculation was the effective internal volume available for hardware placement, which was approximately 4 in$^3$. Table 1 lists the measured values for four dissipated power tests, at approximately 525, 1000, 1500 and 2000 mW/in$^3$, respectively:

TABLE 1

| | DISSIPATED POWER DENSITY TESTS | | | |
|---|---|---|---|---|
| POWER TEST | VOLTAGE (VOLTS) | CURRENT (AMPERES) | DISSIPATED POWER (WATTS) | DISSIPATED POWER DENSITY (mW/in$^3$) |
| A | 2.35 | 0.895 | 2.10 | 524.78 |
| B | 3.25 | 1.248 | 4.06 | 1014.00 |
| C | 3.97 | 1.527 | 6.06 | 1515.55 |
| D | 4.56 | 1.766 | 8.05 | 2013.24 |

For each of the four tests, the ambient air temperature, $T_{AMB}$, was monitored during all testing of the electronic device E. The temperature of each of the thermocouples 64a-j was monitored during the various levels of power dissipation to determine when the temperatures stabilized. The temperature rise from ambient was calculated by subtracting the recorded ambient air temperature from the final or stabilized temperatures. A pass/fail temperature margin ($T_{P/F}$) calculation was developed to track the thermal progress of the apparatus during testing. $T_{P/F}$ is measured in degrees Celsius (° C.) and was calculated for thermocouples 64a-j to determine whether the electronic device E was meeting safety and/or reliability thermal limits as operated in a 40° C. room ambient. Therefore, the formula used was not the same for each thermocouple. A positive margin indicates the number of ° C. by which that particular thermocouple was passing that test. Likewise, a failing margin designated by a negative value indicates the number of ° C. by which that particular thermocouple was failing that particular test.

The resistors 30, 32, 34 and 36 are packaged in plastic and physically represent similar devices such as various transistors used extensively in power converters that dissipate a large percentage of the overall dissipative power and have a silicon junction that should not exceed 125° C. in order to maintain the reliability of the component. The thermocouples 64a-d were attached to the metal tab of the T0-220 style package and thus measured a slightly lower temperature than would be the actual silicon junction temperature. A margin of error of 5° C. was added to account for this error. $T_{P/F}$ for the thermocouples 64a-d was calculated from the following formula:

$$T_{P/F} = 125 - (T_{RISE} + 45)$$

where $T_{RISE}$ is the measured ambient air temperature subtracted from the measured temperature at the thermocouple.

The transformer 26 must not rise more than 105° C. when tested in approximately a 25° C. ambient air temperature in order to be classified as a class B magnetic component as defined by UL 1950. This is the standard for a maximum operating ambient of 40° C. $T_{P/F}$ was, therefore, calculated from the following formula for the thermocouple 64e:

$$T_{P/F} = 105 - (T_{RISE} + 25)$$

The temperature of the exterior of the enclosure 20, as measured by the thermocouples 64h-j, is allowed to rise 70° C. from any specified ambient according to UL 1950. This, however, is higher than desired since the outside of the box should not feel too hot to the touch. $T_{P/F}$ is, therefore, limited to a maximum value of 70° C. as tested in a 25° C. room ambient for each thermocouple 64h-j. The formula to calculate $T_{P/F}$ for the thermocouples 64h-j was:

$$T_{P/F} = 70 - (T_{RISE} + 25)$$

The remaining thermocouples 64f and 64g do not have any specified limits. However, to remain within the most thermally restrictive conditions for the desired embodiments, the thermocouples 64f and 64g were limited to a rise of 70° C. as tested in a 25° C. ambient. The formula used to calculate $T_{P/F}$ for the thermoocouples 64f and 64g, therefore, was the same as used for the thermocouples 64h-j above. Tables 2 through 5 list the measured and calculated temperature levels for the dissipated power tests A through D, respectively:

TABLE 2

| TEMPERATURES FOR POWER TEST A - 525 mW/in$^3$ | | | |
|---|---|---|---|
| THERMOCOUPLE DESIGNATION | TEMPERATURE (°C.) | $T_{RISE}$ (°C.) | PASS MARGIN $T_{P/F}$ (°C.) FOR 40° C. AMBIENT |
| $T_{AMB}$ | 24.7 | — | — |
| 64a | 48.6 | 23.9 | 56.1 |
| 64b | 48.6 | 23.9 | 56.1 |
| 64c | 47.2 | 22.5 | 57.5 |
| 64d | 47.0 | 22.3 | 57.7 |
| 64e | 43.3 | 18.6 | 61.4 |
| 64f | 45.4 | 20.7 | 24.3 |
| 64g | 42.8 | 18.1 | 26.9 |
| 64h | 36.6 | 11.9 | 33.1 |
| 64i | 37.6 | 12.9 | 32.1 |
| 64j | 40.5 | 15.8 | 29.2 |

TABLE 3
TEMPERATURES FOR POWER TEST B - 1000 mW/in$^3$

| THERMOCOUPLE DESIGNATION | TEMPERATURE (°C.) | $T_{RISE}$ (°C.) | PASS MARGIN $T_{P/F}$ (°C.) FOR 40° C. AMBIENT |
|---|---|---|---|
| $T_{AMB}$ | 24.7 | — | — |
| 64a | 69.1 | 44.4 | 35.6 |
| 64b | 69.2 | 44.5 | 35.5 |
| 64c | 66.3 | 41.6 | 38.4 |
| 64d | 65.9 | 41.2 | 38.8 |
| 64e | 59.3 | 34.6 | 45.4 |
| 64f | 62.8 | 38.1 | 6.9 |
| 64g | 57.9 | 33.2 | 11.8 |
| 64h | 46.6 | 21.9 | 23.1 |
| 64i | 48.4 | 23.7 | 21.3 |
| 64j | 53.6 | 28.9 | 16.1 |

TABLE 4
TEMPERATURES FOR POWER TEST C - 1500 mW/in$^3$

| THERMOCOUPLE DESIGNATION | TEMPERATURE (°C.) | $T_{RISE}$ (°C.) | PASS MARGIN $T_{P/F}$ (°C.) FOR 40° C. AMBIENT |
|---|---|---|---|
| $T_{AMB}$ | 25.1 | — | — |
| 64a | 88.7 | 63.6 | 16.4 |
| 64b | 88.9 | 63.8 | 16.2 |
| 64c | 84.7 | 59.6 | 20.4 |
| 64d | 83.9 | 58.8 | 21.2 |
| 64e | 74.4 | 49.3 | 30.7 |
| 64f | 79.4 | 54.3 | −9.3 |
| 64g | 72.2 | 47.1 | −2.1 |
| 64h | 56.1 | 31.0 | 14.0 |
| 64i | 58.2 | 33.1 | 11.9 |
| 64j | 65.8 | 40.7 | 4.3 |

TABLE 5
TEMPERATURES FOR POWER TEST D - 2000 mW/in$^3$

| THERMOCOUPLE DESIGNATION | TEMPERATURE (°C.) | $T_{RISE}$ | PASS MARGIN $T_{P/F}$ (°C.) FOR 40° C. AMBIENT |
|---|---|---|---|
| $T_{AMB}$ | 25.5 | — | — |
| 64a | 107.8 | 82.3 | −2.3 |
| 64b | 108.0 | 82.5 | −2.5 |
| 64c | 102.3 | 76.8 | 3.2 |
| 64d | 101.3 | 75.8 | 4.2 |
| 64e | 89.2 | 63.7 | 16.3 |
| 64f | 95.0 | 69.5 | −24.5 |
| 64g | 86.4 | 60.9 | −15.9 |
| 64h | 65.5 | 40.0 | 5.0 |
| 64i | 68.4 | 42.9 | 2.1 |
| 64j | 77.9 | 52.4 | −7.4 |

Tables 2 and 3 indicate that all the temperatures are within allowable levels at all the thermocouple locations 64a-j for dissipated power densities of approximately 525 and 1000 mW/in$^3$ respectively Table 4 indicates marginal failures at 40° C. at thermocouples 64f and 64g at dissipated power density of approximately 1500 mW/in$^3$. The marginal failure points could be easily removed by minor optimization readily performed by one skilled in the art. Table 5 indicates failures at the majority of thermocouple locations at a dissipated power density of approximately 2000 mW/in$^3$ for the specific test sample. The addition of a third heat fin member extending over the top of the resistors 30, 32, 34 and 36 would solve these thermal issues.

FIG. 7 is a top view of an electronic device, generally referred to by the letter E', constructed according to the present invention. Analogous components assume similar numbers as used for the electronic device E. The electronic device E' is similar to the electronic device E except that it is about 2 inches shorter. A transformer 26' and 4 resistors 30', 32', 34' and 36' preferably the same as used in the electronic device E, are mounted on a circuit board 28'. A heat sink 38' is mounted to the resistors 30' and 32' with bolts 40' and 44', nuts 42' and 46', in the same manner as described above. A heat sink 48' is likewise mounted to the resistors 34' and 36' with bolts 50' and 54' and nuts 52' and 56'. The heat sinks 38' and 48' comprise fastening members 38a' and 48a' and heat fin members 38b' and 48b', which are similar to the heat sinks 38 and 48 except that the heat fin members 38b' and 48b' are about 1" shorter than the heat fin members 38b and 48b. The assembly is placed into the lower half member 20c' of an enclosure 20' which is similar to the enclosure 20 except that it is about 2" shorter in length.

Four bosses (not shown) and four screws 23a, 23b, 23c and 23d are provided in a similar fashion as described above for the bosses 21a-21d and the screws 23a-23d to support and mount the circuit board 28' within the lower half member 20c'. The internal dimensions of the enclosure 20' are approximately 2" by 1" by 1" so that it is about half the volume of the enclosure 20. Ten thermocouples 64a'-j' (not shown) are placed on the electronic device E' in analogous locations as the thermocouples 64a-j on the electronic device E.

Four dissipated power tests were executed with the electronic device E' at approximately the same dissipated power densities as were used in the dissipated power tests A-D of the electronic device E. The power dissipated in the electronic device E' was about half the power dissipated in the electronic device E such that the dissipated power densities were approximately equal; the inner volume of the electronic device E' (2 in$^3$) was half that of the electronic device E (4 in$^3$). Table 6 lists the differences in temperature between the electronic device E' and the electronic device E at each thermocouple 64a'-j' for four dissipated power densities:

TABLE 6
TEMPERATURE DIFFERENTIAL BETWEEN THE ELECTRONIC DEVICE E' AND THE ELECTRONIC DEVICE E AT VARIOUS DISSIPATED POWER DENSITIES

| THERMOCOUPLE DESIGNATION | DISSIPATED POWER DENSITY (mW/in$^3$) | | | |
|---|---|---|---|---|
|  | 500 | 1000 | 1500 | 2000 |
| 64a' | −2.2 | −4.8 | −7.3 | −8.8 |
| 64b' | −2.3 | −5.1 | −7.7 | −9.2 |
| 64c' | −1.3 | −2.5 | −3.8 | −4.0 |
| 64d' | −1.0 | −2.1 | −2.8 | −2.9 |
| 64e' | −2.0 | −4.5 | −6.3 | −7.6 |
| 64f' | +0.4 | +0.6 | +1.0 | +2.6 |
| 64g' | −2.4 | −4.9 | −7.5 | −9.5 |
| 64h' | −2.4 | −5.5 | −8.1 | −9.5 |
| 64i' | −2.8 | −6.4 | −8.2 | −10.5 |
| 64j' | −1.0 | −2.3 | −2.4 | −1.8 |

Table 6 shows that the temperatures at all thermocouples 64a'-j' of the electronic device E', except for the thermocouple 64f', were not as high as the temperatures measured by the thermocouples 64a'-j' of the electronic device E. The thermocouple 64F' anomaly developed because the thermocouple 64F' was not placed in the properly proportionate places as the thermocouple 64F. These results indicate that the electronic device E' has an even greater potential dissipated power density while meeting applicable standards than the electronic device E.

The electronic devices E and E' described above are test devices used for thermal characteristic evaluations but are similar in size and shape to the intended electrical devices to be used with the present invention, such as dc—dc power converters and the like. The amount of heat dissipated by the resistors 30, 32, 34 and 36, of the electronic device E, and the resistors 30', 32', 34' and 36' of the electronic device E', simulates the approximate amount of heat dissipated by rectifiers, diodes, transistors, transformers, and the like, that are typically used in natural convection cooled electronic devices intended to be used with the present invention. Similarly, the method of fastening these heat dissipating components to heat sinks, such as the heat sinks 38 and 48, is substantially similar.

The foregoing disclosure and description of the invention are illustrative and explanatory thereof, and various changes in the size, shape, materials, components, circuit elements, wiring connections and contacts, as well as in the details of the illustrated circuitry and construction may be made without departing from the spirit of the invention.

I claim:

1. A natural convection cooled electronic device, comprising:
   at least one electrical component producing heat;
   a heat conductive enclosure comprising an organic polymeric composition, said enclosure having an inner cavity with a resulting inner surface, wherein said enclosure surrounds said electrical component without contacting said electrical component;
   at least one heat sink including a member for fastening to said electrical component and at least one heat fin member integrally joined to said fastening member, said heat fin member being aligned close to, parallel with and opposing a portion of said inner surface, said fastening member having an outer edge, said heat fin member joined to said fastening member at a portion of said outer edge, said heat sink being without a heat fin member at other than said outer edge of said fastening member;
   means to fasten said electrical component to said heat sink fastening member for providing good thermal contact between said electrical component and said heat sink; and
   means for mounting said electrical component and said heat sink within said heat conductive enclosure and electrically insulating said heat fin member from said inner surface.

2. The device of claim 1, further comprising:
   a layer of heat conductive material lining a substantial portion of said inner surface of said enclosure and being electrically insulated from said heat fin member by said mounting and electrically insulating means.

3. The device of claim 2,
   wherein the surface of said heat conductive layer exposed to said cavity and the surface of said heat fin member facing said heat conductive layer are roughened and blackened.

4. The device of claim 2, wherein said heat conductive layer comprises:
   a flexible sheet of heat conductive material with a first side and a second side; and
   means to bond said first side of said heat conductive sheet to said inner cavity surface so as to be in good thermal contact with said enclosure.

5. The device of claim 4,
   wherein said second side of said heat conductive sheet and the surface of said heat fin member facing said heat conductive sheet are roughened and blackened.

6. The device of claim 4,
   wherein said heat conductive sheet comprises copper.

7. The device of claim 4,
   wherein said heat conductive sheet comprises aluminum.

8. The device of claim 4,
   wherein said heat conductive sheet comprises magnesium.

9. The device of claim 1,
   wherein said inner surface of said enclosure forming said cavity and said heat fin members of said heat sinks are generally planar.

10. The device of claim 1,
    wherein said enclosure is formed in the shape of a rectangular parallelepiped.

11. The device of claim 1,
    wherein said organic polymeric composition comprises a thermoplastic polyester.

12. The device of claim 1,
    wherein said organic polymeric composition is filled with a material having a high thermal conductivity.

13. The device of claim 1,
    wherein said heat sink is formed of aluminum.

14. The device of claim 1,
    wherein said heat sink is formed of copper.

15. The device of claim 1,
    wherein said heat sink is formed of magnesium.

16. A natural convection cooled electronic device, comprising:
    a circuit board for receiving electrical components;
    at least one electrical component producing heat and connected to said circuit board;
    a heat conductive enclosure comprising an organic polymeric composition, said enclosure having an inner cavity with a resulting inner surface, wherein said enclosure surrounds said circuit board and said electrical component;
    at least one heat sink including a member for fastening to said electrical component and at least one heat fin member integrally joined to said fastening member, said heat fin member being aligned close to, parallel with and opposing a portion of said inner surface, said fastening member having an outer edge, said heat fin member joined to said fastening member at a portion of said outer edge, said heat sink being without a heat fin member at other than said outer edge of said fastening member;
    means to fasten said electrical component to said heat sink fastening member for providing good thermal contact between said electrical component and said heat sink; and
    means for mounting said circuit board within said heat conductive enclosure and electrically insulating said heat fin member from said inner surface.

17. The device of claim 16,
    wherein said inner surface of said enclosure forming said cavity and said heat fin member of said heat sink are generally planar.

18. The device of claim 16, wherein the enclosure is formed in the shape of a rectangular parallelepiped.

19. The device of claim 16, wherein said organic polymeric composition comprises a thermoplastic polyester.

20. The device of claim 16, wherein said organic polymeric composition is filled with a material having a high thermal conductivity.

21. The device of claim 16, wherein said heat sink is formed of aluminum.

22. The device of claim 16, wherein said heat sink is formed of copper.

23. The device of claim 16, wherein said heat sinks are formed of magnesium.

24. The device of claim 16, further comprising:
a flexible sheet of heat conductive material with a first side and a second side, wherein said heat conductive sheet is formed to provide a lining for a portion of said inner surface, said first side facing and being aligned next to said inner surface, and said second side not contacting said heat sink.

25. The device of claim 24, wherein said second side of said heat conductive sheet and the surface of said heat fin member facing said heat conductive sheet are roughened and blackened.

26. The device of claim 24, wherein said heat conductive sheet comprises copper.

27. The device of claim 24, wherein said heat conductive sheet comprises aluminum.

28. The device of claim 24, wherein said heat conductive sheet comprises magnesium.

* * * * *

UNITED STATES PATENT AND TRADEMARK OFFICE
CERTIFICATE OF CORRECTION

PATENT NO.   :   5,185,691
DATED        :   FEBRUARY 9, 1993
INVENTOR(S)  :   GEORGE K. KORINSKY

It is certified that error appears in the above-identified patent and that said Letters Patent is hereby corrected as shown below:

In Col. 13, Line 14, please replace "sinks are" with --sink is--.

Signed and Sealed this

Sixteenth Day of November, 1993

Attest:

BRUCE LEHMAN

Attesting Officer        Commissioner of Patents and Trademarks